United States Patent
Stoib et al.

(10) Patent No.: US 12,513,921 B2
(45) Date of Patent: Dec. 30, 2025

(54) SEMICONDUCTOR DEVICE INCLUDING A FIELD STOP REGION

(71) Applicant: Infineon Technologies AG, Neubiberg (DE)

(72) Inventors: Benedikt Stoib, Feldkirchen-Westerham (DE); Moriz Jelinek, Villach (AT); Marten Mueller, Schliersee (DE); Daniel Schloegl, Villach (AT); Hans-Joachim Schulze, Taufkirchen (DE); Holger Schulze, Villach (AT)

(73) Assignee: Infineon Technologies AG, Neubiberg (DE)

( * ) Notice: Subject to any disclaimer, the term of this patent is extended or adjusted under 35 U.S.C. 154(b) by 559 days.

(21) Appl. No.: 17/838,339

(22) Filed: Jun. 13, 2022

(65) Prior Publication Data
US 2022/0406947 A1 Dec. 22, 2022

(30) Foreign Application Priority Data
Jun. 21, 2021 (DE) .......................... 102021115971.7

(51) Int. Cl.
*H01L 21/265* (2006.01)
*H10D 8/00* (2025.01)
(Continued)

(52) U.S. Cl.
CPC ............ *H10D 8/00* (2025.01); *H01L 21/265* (2013.01); *H10D 8/045* (2025.01); *H10D 62/106* (2025.01); *H10D 62/60* (2025.01)

(58) Field of Classification Search
CPC . H01L 29/861; H01L 21/265; H01L 29/0619; H01L 29/36; H01L 29/66136; H01L 29/0603; H01L 29/6609
(Continued)

(56) References Cited

U.S. PATENT DOCUMENTS 5,162,876 A    11/1992   Kitagawa et al.
9,159,819 B2 * 10/2015  Pfirsch .................. H01L 29/407
(Continued)

FOREIGN PATENT DOCUMENTS

DE   102006050338 A1   4/2008
DE   102015102129 A1   8/2015

OTHER PUBLICATIONS

Masetti, Guido, et al., "Modeling of carrier mobility against carrier concentration in arsenic-, phosphorus-, and boron-doped silicon", IEEE Trans. Electron. Devices; vol. 30, pp. 764-769, Jul. 1983.

*Primary Examiner* — Vu A Vu
(74) *Attorney, Agent, or Firm* — Murphy, Bilak & Homiller, PLLC (57) ABSTRACT

A semiconductor device includes: a drift region of a first conductivity type arranged between first and second surfaces of a semiconductor body; a first region of the first conductivity type at the second surface; a second region of a second conductivity type adjacent the first region at the second surface; a field stop region of the first conductivity type between the drift region and second surface; and a first electrode on the second surface directly adjacent to the first region in a first part of the second surface and to the second region in a second part of the second surface. The field stop region includes first and second sub-regions. Over a predominant portion of the first part of the second surface, the second sub-region directly adjoins the first region and includes dopants of the second conductivity type that partially compensate dopants of the first conductivity type.

19 Claims, 4 Drawing Sheets (51) Int. Cl.
    *H10D 8/01*          (2025.01)
    *H10D 62/10*        (2025.01)
    *H10D 62/60*        (2025.01)

(58) Field of Classification Search
    USPC .......................................................... 257/239
    See application file for complete search history.

(56) References Cited

U.S. PATENT DOCUMENTS

| | | | |
|---|---|---|---|
| 9,741,837 B2 * | 8/2017 | Zhang | H01L 29/0634 |
| 10,170,607 B2 * | 1/2019 | Kouno | H01L 27/0664 |
| 10,651,037 B2 * | 5/2020 | Schulze | H01L 29/66136 |
| 10,714,574 B2 * | 7/2020 | Yilmaz | H01L 29/407 |
| 11,164,965 B2 * | 11/2021 | Iwakaji | H01L 29/36 |
| 11,217,580 B2 * | 1/2022 | Mizukami | H01L 27/0727 |
| 11,233,158 B2 * | 1/2022 | Liu | H01L 29/861 |
| 2005/0116249 A1 | 6/2005 | Mauder et al. | |
| 2020/0020765 A1 * | 1/2020 | Mori | H01L 29/739 |
| 2020/0105874 A1 * | 4/2020 | Yilmaz | H01L 21/02631 |
| 2022/0254877 A1 * | 8/2022 | Yang | H01L 29/7397 |

* cited by examiner

SEMICONDUCTOR DEVICE INCLUDING A FIELD STOP REGION

TECHNICAL FIELD

The present disclosure is related to a semiconductor device, in particular to a semiconductor device, e.g. a power semiconductor diode, including a field stop region.

BACKGROUND

Technology development of new generations of semiconductor devices, e.g. diodes or insulated gate field effect transistors (IGFETs) such as metal oxide semiconductor field effect transistors (MOSFETs) or insulated gate bipolar transistors (IGBTs), aims at improving electric device characteristics and reducing costs by shrinking device geometries. Although costs may be reduced by shrinking device geometries, a variety of tradeoffs and challenges have to be met when increasing device functionalities per unit area. In silicon power diodes, a thickness reduction of the semiconductor body may be beneficial with respect to reduction of static and dynamic electric losses. Thickness reduction, however, typically comes at the cost of e.g. breakdown voltage and cosmic ray performance. Power diodes may therefore include a rather deep field stop region for providing sufficient softness during electric switching. The field stop region aims at protecting a certain amount of charge carrier plasma so that these charges can carry the load current during an end of reverse recovery, thereby avoiding a hard snap-off. This may require a certain depth and dose for the field stop region to prevent the electric field from reaching a rear part of the device, e.g. a part close to the cathode of a power diode. The field stop region may allow for increasing the maximum electric field at a given applied reverse bias voltage (at the same total chip thickness) when comparing to a diode without a field stop region or a very shallow field stop region. A higher electric field may decrease the breakdown voltage and increase cosmic ray failure in time (FIT) rate.

There may be a desire for improving a semiconductor device for enabling sufficient softness during switching without increasing the chip thickness and without sacrificing breakdown voltage.

SUMMARY

An example of the present disclosure relates to a semiconductor device. The semiconductor device includes a drift region of a first conductivity type arranged between a first surface and a second surface of a semiconductor body. The semiconductor device further includes a first region of the first conductivity type at the second surface. The semiconductor device further includes a second region of a second conductivity type arranged adjacent to the first region at the second surface. A field stop region of the first conductivity type is arranged between the drift region and the second surface. The semiconductor device further includes a first electrode on the second surface. The first electrode is arranged directly adjacent to the first region in a first part of the second surface. The first electrode is arranged directly adjacent to the second region in a second part of the second surface. The field stop region includes a first sub-region and a second sub-region between the first sub-region and the second surface. Over a predominant portion of the first part of the second surface, the second sub-region directly adjoins to the first region and includes dopants of the second conductivity type that partially compensate dopants of the first conductivity type.

Another example of the present disclosure relates to a semiconductor device. The semiconductor device includes a drift region of a first conductivity type arranged between a first surface and a second surface of a semiconductor body. The semiconductor device further includes a first region of the first conductivity type at the second surface. The semiconductor device further includes a second region of a second conductivity type arranged adjacent to the first region at the second surface. A field stop region of the first conductivity type is arranged between the drift region and the second surface. The semiconductor device further includes a first electrode on the second surface. The first electrode is arranged directly adjacent to the first region in a first part of the second surface. The first electrode is arranged directly adjacent to the second region in a second part of the second surface. The field stop region includes a first sub-region and a second sub-region between the first sub-region and the second surface. Over a predominant portion of the first part of the second surface, the second sub-region directly adjoins to the first region and comprises an embedded region of a second conductivity type integrated in the second sub-region of the field stop region. In the embedded region, dopants of the second conductivity type outnumber dopants of the first conductivity type. The embedded region is electrically connected to the second region.

Another example of the present disclosure relates to a method for manufacturing a semiconductor device. The method includes providing a semiconductor body including a drift region of a first conductivity type arranged between a first surface and a second surface of the semiconductor body. The method further includes forming a first region of the first conductivity type at the second surface. The method further includes forming a second region of a second conductivity type arranged adjacent to the first region at the second surface. The method further includes forming a field stop region of the first conductivity type arranged between the drift region and the second surface. The method further includes forming a first electrode on the second surface. The first electrode is arranged directly adjacent to the first region in a first part of the second surface. The first electrode is further arranged directly adjacent to the second region in a second part of the second surface. The field stop region includes a first sub-region and a second sub-region between the first sub-region and the second surface. Over a predominant portion of the first part of the second surface, the second sub-region directly adjoins to the first region and includes dopants of the second conductivity type that partially compensate dopants of the first conductivity type.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

DETAILED DESCRIPTION

In the following detailed description, reference is made to the accompanying drawings, which form a part hereof and in which are shown by way of illustrations specific examples in which semiconductor substrates may be processed. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. An ohmic contact is a non-rectifying electrical junction.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

The first conductivity type may be n-type and the second conductivity type may be p-type. Alternatively, the first conductivity type may be p-type and the second conductivity type be n-type. When switching between conductivity types, a position of anode and cathode in a power diode may be reversed, for example.

An example of a semiconductor device may include a drift region of a first conductivity type arranged between a first surface and a second surface of a semiconductor body. The semiconductor device may further include a first region of the first conductivity type at the second surface. The semiconductor device may further include a second region of a second conductivity type arranged adjacent to the first region at the second surface. A field stop region of the first conductivity type may be arranged between the drift region and the second surface. The semiconductor device may further include a first electrode on the second surface. The first electrode may be arranged directly adjacent to the first region in a first part of the second surface. The first electrode may further be arranged directly adjacent to the second region in a second part of the second surface. The field stop region may include a first sub-region and a second sub-region between the first sub-region and the second surface. Over a predominant portion of the first part of the second surface, the second sub-region may directly adjoin to the first region and may include dopants of the second conductivity type that partially compensate dopants of the first conductivity type. According to some embodiments, within the whole extent of the second sub-region, the dopants of the second conductivity type compensate the dopants of the first conductivity type at most partially. For example, in all of the second sub-region, the dopants of the second conductivity type compensate the dopants of the first conductivity type only partially. For example, the dopants of the second conductivity type outnumber the dopants of the first conductivity type substantially nowhere within the second sub-region.

Another example of a semiconductor device may include a drift region of a first conductivity type arranged between a first surface and a second surface of a semiconductor body. The semiconductor device may further include a first region of the first conductivity type at the second surface. The semiconductor device may further include a second region of a second conductivity type arranged adjacent to the first region at the second surface. A field stop region of the first conductivity type may be arranged between the drift region and the second surface. The semiconductor device may further include a first electrode on the second surface. The first electrode may be arranged directly adjacent to the first region in a first part of the second surface. The first electrode may further be arranged directly adjacent to the second region in a second part of the second surface. The field stop region may include a first sub-region and a second sub-region between the first sub-region and the second surface. Over a predominant portion of the first part of the second surface, the second sub-region may directly adjoin to the first region and may comprise an embedded region of a second conductivity type integrated in the second sub-region of the field stop region, wherein, in the embedded region, the dopants of the second conductivity type outnumber the dopants of the first conductivity type. The embedded region is electrically connected to the second region. For example, the embedded region may at least partly adjoin the second region. For example, the embedded region may adjoin the second region in a lateral direction and/or a laterally overlapping portion of the embedded region may adjoin the second region in a vertical direction, the overlapping portion being formed by a portion of the embedded region laterally overlapping with the second region. For providing the electrical connection, there may be a continuous pathway of the second conductivity type between the embedded region and the second region.

For example, the embedded region may be laterally homogeneous. Alternatively, the embedded region may be laterally structured, wherein the extent by which the dopants of the second conductivity type outnumber the dopants of the first conductivity type varies along a significant portion of the embedded region, for example at least 20%, at least 30% or at least 40% of the lateral extension of the embedded region. The embedded region may, for example, comprise at least one ignition portion with a lower level of dopants of the second conductivity type compared to other portions of the embedded region. Alternately, the embedded region may be intermitted, with an intermitted portion providing the ignition portion. In both examples, the ignition region may, along a lateral direction, be surrounded or even adjoined by the embedded region or, respectively, the other portion of the embedded region.

The semiconductor device may be an integrated circuit, or a discrete semiconductor device or a semiconductor module, for example. The semiconductor device may be or include a power semiconductor device, e.g. a vertical power semiconductor device having a load current flow between the first surface and the second surface. The semiconductor device may be or may include a power semiconductor diode. The power semiconductor device may be configured to conduct currents of more than 1 A or more than 10 A or even more than 30 A, and may be further configured to block voltages between load terminals, e.g. between cathode and anode of a diode in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (Site). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be or may include a magnetic Czochralski, MCZ, or a float zone (FZ) substrate or an epitaxially deposited silicon semiconductor body.

The first surface may be a front surface or a top surface of the semiconductor device, and the second surface may be a back surface or a rear surface of the semiconductor device, for example. The semiconductor body may be attached to a lead frame via the second surface, for example. Over the first surface of the semiconductor body, bond pads may be arranged and bond wires may be bonded on the bond pads.

For example, in the drift region between the first surface and the second surface, an impurity or doping concentration may gradually or in steps increase or decrease with increasing distance to the first surface at least in portions of its vertical extension. According to other examples the impurity concentration in the drift region may be approximately uniform. For diodes based on silicon, a mean impurity concentration in the drift region may be between $5 \times 10^{12}$ $cm^{-3}$ and $1 \times 10^{15}$ $cm^{-3}$, for example in a range from $1 \times 10^{13}$ $cm^{-3}$ to $2 \times 10^{14}$ $cm^{-3}$. In the case of a semiconductor device based on SiC, a mean impurity concentration in the drift region may be between $5 \times 10^{14}$ $cm^{-3}$ and $1 \times 10^{17}$ $cm^{-3}$, for example in a range from $1 \times 10^{15}$ $cm^{-3}$ to $2 \times 10^{16}$ $cm^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device.

When operating the vertical power semiconductor device at or close to the specified maximum blocking voltage, the space charge region may reach or penetrate into the field stop region. The field stop region is configured to prevent the space charge region from further reaching to the cathode or collector at the second surface of the semiconductor body. The field stop region may be formed by one or a combination of dopants that may be introduced into the semiconductor body from the second surface, for example. For example, the field stop region may include hydrogen-related donors introduced by implantation of protons and subsequent annealing. One or more ion implantation processes at different ion implantation tilt angles and/or ion implantation energies may allow for adjusting a doping concentration profile of the field stop region to the applications' need. The field stop region may be non-patterned, e.g. may be continuous without any openings, with respect to an active area of the semiconductor device, or with respect to an area at the second surface that is covered by the first and second regions. In some examples, the field stop region may be patterned and may fully or partly cover the first region. The field stop region may also be patterned and may fully or partly cover the second region. For example, the field stop region may be patterned and may fully cover the second region and may partly cover the first region. The dopants of the second conductivity type in the second sub-region of the field stop region may partially compensate dopants of the first conductivity type. For example, dopants of the second conductivity type partially compensate dopants of the first conductivity type in a case where a number of the dopants of the first conductivity type is larger than a number of the dopants of the second conductivity type, and wherein the exceeding number of dopants of the first conductivity type determines the effective doping concentration and the conductivity type of the respective region. The partial compensation of the doping in the second sub-region of the field stop region may allow for improving softness of a diode by delaying flow of charge carriers of the first conductivity type, e.g. electrons, toward the drift region as well as by delaying flow of charge carriers of the second conductivity type, e.g. holes, from the second region toward the first region. This may be due to a reduction of carrier mobility caused by the additional charge carrier scattering caused by the presence of the partially compensated dopants.

The first region may be a cathode region of a diode, for example. For example, the first region, the field stop region and the drift region may form a continuous region of the first conductivity type.

The second region may interrupt the cathode region at the second surface. Similar to the cathode region at the second surface, the second region may also directly contact the first electrode at the second surface. The second region may allow for improving softness by building up of a temporary carrier plasma during reverse recovery. The charge carriers of this temporary carrier plasma may prevent a snap-off, for example. Design of the second sub-region, e.g. doping profile, geometry, or dimensions, may be adjusted with respect to operation conditions, for example. The second region may be arranged laterally adjacent to the first region, e.g. may directly laterally adjoin to the first region or may be laterally spaced from the first region by an intermediate region.

The first electrode at the second surface may be a first load terminal L1, e.g. a cathode terminal of a diode, and may include or consist of a conductive material or a combination of conductive materials, for example a doped semiconductor material (e.g., a degenerate doped semiconductor material) such as doped polycrystalline silicon, metal or metal compound, for example. The first load terminal L1 may also include a combination of these materials, e.g. a liner or adhesion material and an electrode material. Exemplary contact or electrode materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example.

For example, the semiconductor device may include a second load terminal, e.g. an anode terminal of a diode. The second load electrode may be a contact area and be formed by all or part of a wiring layer. For example, the wiring layer may correspond to one wiring level of a wiring area above the first surface, wherein the one wiring level of the wiring area may be located closest to the first surface in case of multiple wiring levels. The wiring area may include one or more than one, e.g. two, three, four or even more wiring levels. Each wiring level may be formed by a single one or a stack of conductive layers, e.g. metal layer(s). The wiring levels may be lithographically patterned, for example. Between stacked wiring levels, an interlayer dielectric may be arranged. Contact plug(s) or contact line(s) may be formed in openings in the interlayer dielectric to electrically connect parts, e.g. metal lines or contact areas, of different wiring levels to one another. For example, the contact area of the second load electrode may be electrically connected to an anode region of each of a plurality of diode cells in the semiconductor body by contact plugs arranged between the anode region and the contact area of the second load electrode.

For example, the semiconductor device may include diode cells of a diode cell array. The diode cell array may be a 1-dimensional or 2-dimensional regular arrangement of a plurality of diode cells. For example, the plurality of diode cells of the diode cell array may be electrically connected in parallel. For example, anode regions of the plurality of diode cells of an IGBT transistor cell array may be electrically connected together. Likewise, cathode regions of the plurality of diode cells of the diode cell array may be electrically connected together, e.g. by sharing a common cathode electrode. A diode cell of the diode cell array or a part thereof, e.g. the anode region, may be designed in the shape of a stripe, a polygon, a circle or an oval, for example.

For example, the second sub-region of the field stop region may directly adjoin to the first region over all of the first part of the second surface. Thus, the second sub-region may fully cover the first region.

For example, a lateral concentration profile of the dopants of the second conductivity type and/or a lateral concentration profile of the dopants of the first conductivity type may be constant in the second sub-region of the field stop region over a predominant portion of the first part (1061) of the second surface. Thus, over more than 50%, e.g. more than 60% or more than 70%, or more than 80%, or more than 90% of a top side of the first region, a lateral concentration profile of the dopants of the second conductivity type in the second sub-region may be constant. Even over all of the top side of the first region, a lateral concentration profile of the dopants of the second conductivity type in the second sub-region may be constant.

For example, the dopants of the second conductivity type partially compensate at least 10%, or at least 50%, or at least 80% of the dopants of the first conductivity type in at least a portion of the second sub-region of the field stop region. The softness of the diode may be adjusted in a certain window by varying the degree of partial compensation, for example.

For example, a vertical concentration profile of the dopants of the second conductivity type may extend from within the second sub-region of the field stop region to the second surface.

For example, a vertical concentration profile of dopants of the second conductivity type along a predominant vertical extent of the second region may correspond, e.g. be equal, to a vertical concentration profile of the dopants of the second conductivity type extending from the second sub-region of the field stop region, through the first region, and to the second surface. Thus, a vertical concentration profile of dopants of the second conductivity type constituting the second region may also be present in the first region and extend into the second sub-region. The dopants of the second conductivity type in the second sub-region may cause the partial compensation of the dopants of the first conductivity type constituting the field stop region.

For example, a carrier mobility in the second sub-region of the field stop region is by more than 10%, or by more than 20% smaller than a carrier mobility in the first sub-region of the field stop region. The carrier mobility may decrease with increasing degree of partial compensation of the dopants of the first conductivity type by dopants of the second conductivity type, for example.

For example, a concentration of the dopants of the second conductivity type in a portion of the second sub-region of the field stop region may be larger than $1 \times 10^{15}$ cm$^{-3}$, or larger than $1 \times 10^{16}$ cm$^{-3}$, or larger than $1 \times 10^{17}$ cm$^{-3}$. For example, the concentration of the dopants of the second conductivity type in the second sub-region may steadily decrease toward the first surface.

For example, an effective concentration of dopants of the first conductivity type in the portion of the second sub-region of the field stop region may range between $2 \times 10^{15}$ cm$^{-3}$ and $5 \times 10^{16}$ cm$^{-3}$. For example, the effective concentration may be a net doping concentration corresponding to an absolute value of a difference between electrically active n-dopants and electrically active p-dopants. Each of the n-dopants and the p-dopants may include one or more dopant species or dopant elements, for example. A ratio of a concentration of dopants of the second conductivity type to a concentration of dopants of the first conductivity type may range from 0.1 to 0.9, or from 0.1 to 0.5, or from 0.1 to 0.2 in at least a portion of the second sub-region. For example, the dopants may be substitutional dopants.

For example, a vertical position where the concentration profile of the dopants of the first conductivity type constituting the field stop region intersects a concentration profile of dopants of the first conductivity type constituting the first region may define the vertical extension of the first region to the second surface. For example, the dopants of the field stop region may include hydrogen-related donors, the dopants of the first region may include phosphorus and the dopants of the second conductivity type in the second sub-region of the field stop region may include boron. In this case, the first region may extend from the second surface to the vertical position where the phosphorus concentration profile and the hydrogen-related donor concentration profile intersect. Further towards the first surface, the boron dopants may partially compensate the hydrogen-related donors in the second sub-region of the field stop region for causing a decrease in carrier mobility.

According to another example, a vertical position where the concentration profile of the dopants of the second conductivity type, which partially compensate the dopants of the first conductivity type within the second sub-region of the field stop region, intersects a concentration profile of dopants of the first conductivity type constituting the first region may define the vertical extension of the first region to the second surface. For example, the dopants of the field stop region may include hydrogen-related donors, the dopants of the first region may include phosphorus and the dopants of the second conductivity type in the second sub-region of the field stop region may include boron. In this case, the first region may extend from the second surface to the vertical position where the phosphorus concentration profile and the boron concentration profile intersect. Further towards the first surface, the boron dopants may outnumber the phosphorus dopants in the second sub-region of the field stop region for causing a decrease in carrier mobility.

For example, a pn junction between the second region and the field stop region may be located closer to the second surface than a separation plane between the second sub-region of the field stop region and the first region. For example, the separation plane between the second sub-region of the field stop region and the first region may be located where a vertical doping concentration profile of the second sub-region of the field stop region and a vertical doping concentration profile of the first region intersect.

For example, a separation plane between the second sub-region of the field stop region and the first region may be located closer to the second surface than a pn junction between the second region and the field stop region. The second region may be formed by a masked ion implantation process of dopants of the second conductivity type, for example.

For example, a concentration profile of the dopants of the second conductivity type in the second sub-region of the field stop region may have a peak. The peak may be a local or global maximum in the second sub-region. For example, the concentration profile of the dopants of the second conductivity type in the second sub-region of the field stop region continuously decreases toward the first surface. In this case, the dopants of the second conductivity type in the second sub-region may be a tail of a thermally activated ion implantation or diffusion profile of dopants of the second conductivity type that constitute the second region and have been introduced into the semiconductor body by an unmasked ion implantation or diffusion process. In some other cases, the concentration profile of the dopants of the second conductivity type in the second sub-region of the field stop region steadily decreases from the peak toward the first surface, and further steadily decreases at least over a vertical portion toward the first region. In this case, the dopants of the second conductivity type in the second sub-region may be set by a thermally activated ion implantation profile of dopants of the second conductivity type that has been implanted at an ion implantation depth within the second sub-region, and another ion implantation or diffusion profile of dopants may form the second region, for example.

Functional or structural details described above with respect to features of the semiconductor device shall likewise apply to corresponding features of the method described below.

A method of manufacturing a semiconductor device may include providing a semiconductor body including a drift region of a first conductivity type arranged between a first surface and a second surface of the semiconductor body. The method may further include forming a first region of the first conductivity type at the second surface. The method may further include forming a second region of a second conductivity type arranged adjacent to the first region at the second surface. The method may further include forming a field stop region of the first conductivity type arranged between the drift region and the second surface. The method may further include forming a first electrode on the second surface, wherein the first electrode is arranged directly adjacent to the first region in a first part of the second surface and to the second region in a second part of the second surface. The field stop region may include a first sub-region and a second sub-region between the first sub-region and the second surface. Over a predominant portion of the first part of the second surface, the second sub-region directly adjoins to the first region and includes dopants of the second conductivity type that partially compensate dopants of the first conductivity type.

For example, forming the second region may include one unmasked ion implantation process and a second implantation process, wherein dopants for forming the first region and the dopants of the second conductivity type may be implanted through a same mask. In this case, dopants for forming the second region may be formed by an unmasked ion implantation process and/or diffusion process introducing the dopants not only into an area where the second region is formed but also into an area where the first region is to be formed or has already be formed. However, in the first region, the doping by the dopants of the first conductivity type counter-dope the dopants of the second conductivity type that were entered by the doping process of the second region. The mask for implanting the dopants of the first conductivity type constituting the first region may be used to implant the dopants of the second conductivity type having an implantation depth within the second sub-region of the field stop region.

For example, the dopants of the second conductivity type may be formed by an unmasked ion implantation process. Dopants for forming the first region may be implanted through a mask that differs from a mask used for implanting dopants of the second region.

The examples and features described above and below may be combined.

Functional and structural details described with respect to the examples above shall likewise apply to the exemplary examples illustrated in the figures and described further below.

In the following, further examples of semiconductor devices are explained in connection with the accompanying drawings. Functional and structural details described with respect to the examples above shall likewise apply to the exemplary embodiments illustrated in the figures and described further below. The conductivity type of the illustrated semiconductor regions may also be reversed, i.e. n-type being p-type and p-type being n-type.

Figure 1:
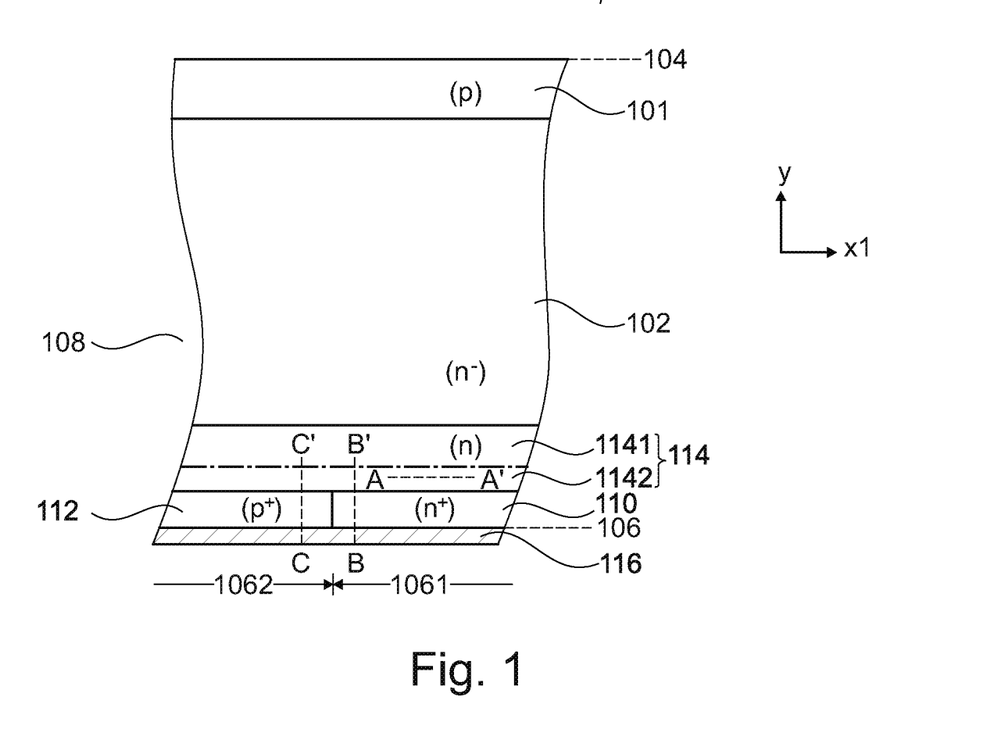
FIG. 1 is a schematic cross-sectional view of a semiconductor device including a field stop region.

FIG. 1 schematically and exemplarily shows a section of a cross-sectional view of a semiconductor device 100, e.g. a power semiconductor diode. The schematic graphs of FIGS. 2 to 6 schematically and exemplarily show graphs of concentration profiles or carrier mobility along vertical or lateral directions of cut lines AA', BB', CC'.

Referring to the schematic cross-sectional view of FIG. 1, the semiconductor device 100 includes an n⁻-doped drift region 102 arranged between a first surface 104 and a second surface 106 of a semiconductor body 108, e.g. a silicon semiconductor substrate. A p-doped region 101, e.g. an anode region is arranged at the first surface 104 opposite to the second surface 106 along a vertical direction y. In the illustrated example, the anode region is a continuous region directly adjoining the first surface 104. The anode region may include a plurality anode sub-regions laterally spaced from one another. The anode sub-regions may be laterally separated by trenches, for example. The trenches may include a trench electrode structure comprising a trench dielectric and a trench electrode, for example.

An n⁺-doped first region 110, e.g. a cathode region, is arranged at the second surface 106. A p⁺-doped second region 112 is arranged adjacent, e.g. along a first lateral direction x1, to the first region 110 at the second surface 106. A first electrode 116, e.g. a first load terminal or cathode electrode, is arranged on the second surface 106 directly adjacent, e.g. along a second vertical direction y, to the first region 110 in a first part 1061 of the second surface 106. The first electrode 116 is further arranged directly adjacent to the second region 112 in a second part 1062 of the second surface 106.

An n-doped field stop region 114 is arranged between the drift region 102 and second surface 106. The field stop region 114 includes a first sub-region 1141 and a second sub-region 1142 between the first sub-region 1141 and the second surface 106. Over a predominant portion of the first part 1061 of the second surface 106, the second sub-region 1142 directly adjoins to the first region 110 and includes p-type dopants, e.g. one or more species of boron, aluminum, gallium, indium in case of a semiconductor body made of silicon that partially compensate n-type doping of the field stop region 114. The n-doped field stop region 114 may include hydrogen-related donors in case of a semiconductor body made of silicon.

The second sub-region 1142 of the field stop region 114 may directly adjoin to the first region 110 over all of the first part 1061 of the second surface 106. Thus, a partial compensation of the n-doping in the field stop region 114 may be present all over the first region 110, for example. The p-type dopants may partially compensate at least 10%, or at least 50%, or at least 80% of the n-type dopants in at least a portion of the second sub-region 1142 of the field stop region 114.

Figure 2:
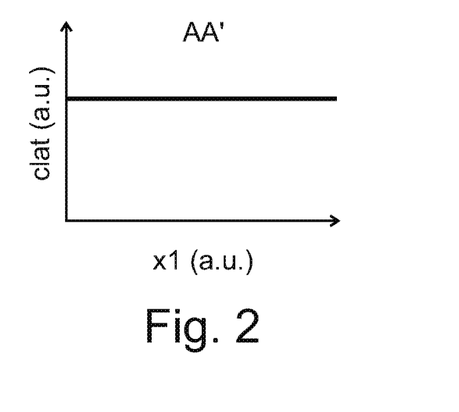
FIG. 2 is a schematic graph for illustrating a doping concentration profile along a first lateral direction in a sub-region of the field stop region of FIG. 1 (along cut line AA' of FIG. 1).

The schematic graph of FIG. 2 illustrates a concentration profile c1at of p-type dopants in the second sub-region 1142 along the first lateral direction x1 (cut line AA') in FIG. 1. In the illustrated example, the concentration profile is constant in the second sub-region 1142 of the field stop region 114 over a predominant portion of the first part 1061 of the second surface 106. This may be achieved, for example, by implanting the p-type dopants by an unmasked ion implantation process, or by implanting the p-type dopants using the same mask that serves for implanting the n-type dopants, e.g. phosphorus, for forming the first region 110.

Figure 3:
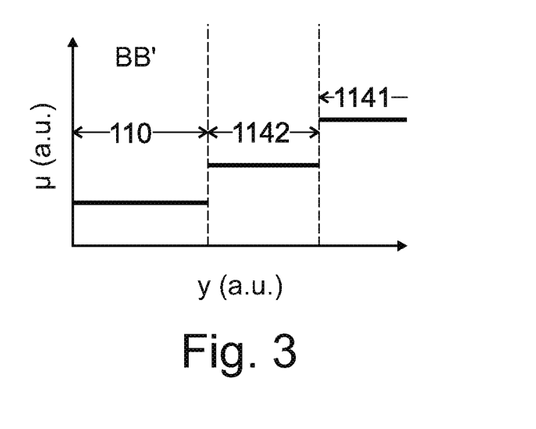
FIG. 3 is a schematic graph for illustrating a carrier mobility profile along a vertical direction y in a sub-region of the field stop region of FIG. 1 (along cut line BB' of FIG. 1).

The schematic graph of FIG. 3 illustrates a profile of a carrier mobility p along the vertical direction y (cut line BB") in FIG. 1. The schematic graph illustrates an average carrier mobility p in each of the first region 110, the second sub-region 1142 of the field stop region 114, and the first sub-region 1141 of the field stop region 114. The carrier mobility in the second sub-region 1142 of the field stop region is by more than 10%, or by more than 20% smaller than the carrier mobility p in the first sub-region 1141 of the field stop region 114, for example.

Figure 4:
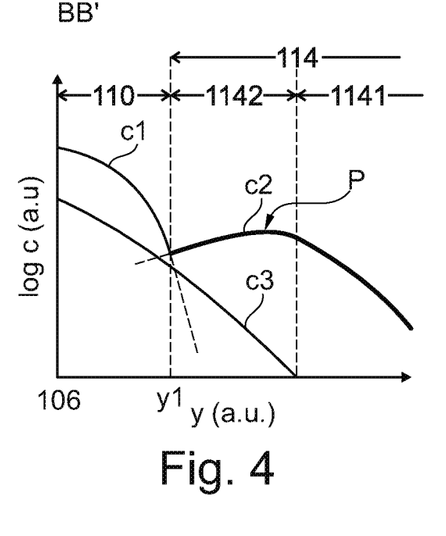
FIGS. 4 to 7 are schematic graphs for illustrating doping concentration profiles along cut lines BB' and CC' of FIG. 1.

The schematic graph of FIG. 4 illustrates schematic doping and/or carrier concentration profiles along the vertical direction y of FIG. 1 (along cut line BB' of FIG. 1). The doping concentration profiles may refer to electrically active doping concentration.

The profile c1 is an n-type doping concentration profile, e.g. a phosphorus profile, defining the first region 110. The profile c2 is an n-type doping concentration profile (e.g. measurable by secondary-ion mass spectrometry, SIMS) or charge carrier profile (e.g. measurable by spreading resistance profiling, SRP), e.g. a hydrogen-related donor profile measurable by SRP, defining the field stop region 114. The first region 110 extends from a vertical position y1 where the profiles c1, c3 intersect to the second surface 106. The profile c3 is a p-type profile, e.g. a boron profile, partially compensating the n-doping in the second sub-region 1142 of the field stop region 114.

For example, the concentration c3 in a portion of the second sub-region 1142 of the field stop region 114 may be larger than $1\times10^{15}$ cm$^{-3}$, or larger than $1\times10^{16}$ cm$^{-3}$, or larger than $1\times10^{17}$ cm$^3$. For example, a difference between c2 and c3, e.g. an effective or net doping concentration, in a portion of the second sub-region 1142 of the field stop region 114 may range between $1\times10^{14}$ cm$^{-3}$ and $2\times10^{16}$ cm$^{-3}$, for example. The net doping concentration may, for example, be a difference between the electrically activated dopants of different conductivity types. In a specific example, the net doping concentration may be the absolute value of the concentration of electrically activated dopants of the first conductivity type minus the concentration of electrically activated dopants of the second conductivity type. A ratio of c2 to c3 may range from 0.1 to 0.9, or from 0.1 to 0.5, or from 0.1 to 0.2 in at least a portion of the second sub-region 1142 of the field stop region 114. For example, the dopants may be substitutional dopants.

Figure 5:
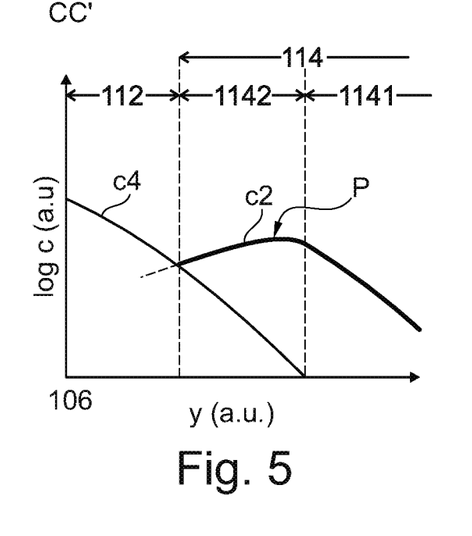

The schematic graph of FIG. 5 illustrates schematic doping concentration profiles along the vertical direction y of FIG. 1 (along cut line CC' of FIG. 1).

The profile c2 is the n-type doping concentration profile also illustrated in FIG. 4, e.g. a hydrogen-related donor profile, defining the field stop region 114. The profile c4 is a p-type profile, e.g. a boron profile, defining the second region 112. The profiles c3 and c4 may be equal (correspond to one another), e.g. formed by an unmasked ion implantation process of boron. The p-type profiles c3 and c4 may also differ from one another, e.g. by forming the second region 112 via a masked ion implantation of p-type dopants and by forming the concentration profile c3 over the first region 110 by a masked or unmasked ion implantation process. Likewise, the profile c3 in the second region 112 may be formed by an unmasked ion implantation process, and further p-type dopants may be introduced into the second sub-region 1142 by a masked ion implantation process. Alternatively, the profiles c3, c4 may be formed by different masked ion implantation processes, for example.

Figure 6:
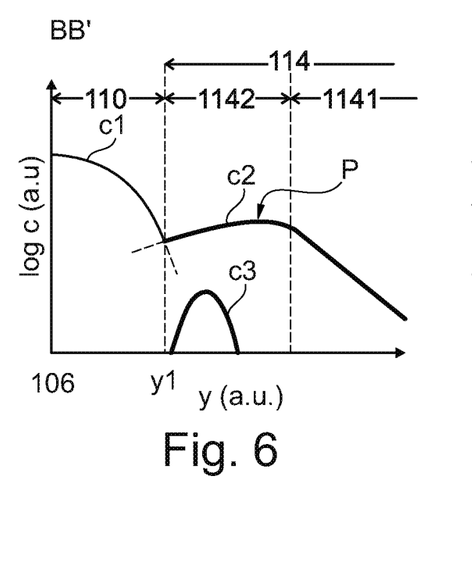

The schematic graph of FIG. 6 illustrates schematic doping concentration profiles along the vertical direction y of FIG. 1 (along cut line BB' of FIG. 1).

The profiles c1 and c2 are similar to the example illustrated in FIG. 4. The profile c3 differs from the example illustrated in FIG. 4 in that the profile c3 has a local peak in the second sub-region 1142 and does not extend up to the second surface 106. Thus, the profile c3 may be used for defining a part of the second region 112.

Figure 7:
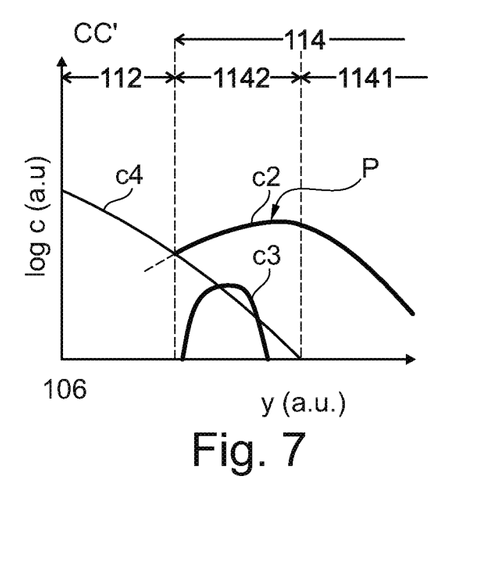

The schematic graph of FIG. 7 illustrates schematic doping concentration profiles along the vertical direction y of FIG. 1 (along cut line CC' of FIG. 1).

The profile c2 is the n-type doping concentration profile also illustrated in FIG. 5, e.g. a hydrogen-related donor profile, defining the field stop region 114. The profile c4 is a p-type profile also illustrated in FIG. 5, e.g. a boron profile, defining the second region 112. The profiles c3 and c4 may be equal, e.g. formed by an unmasked ion implantation process of boron. The p-type profile c3 may be equal to the p-type profile c3 illustrated in FIG. 6. The p-type profile c3 may also be omitted over the second region 112 by using a masked ion implantation process limiting the profile over all or part of the first region 110, for example. Likewise, the profile c4 illustrated in FIG. 7 may also be present in the first region 110 (e.g. added to the graph of FIG. 6) by forming the profile c4 by an unmasked ion implantation process, for example.

It is to be noted that the profiles illustrated in the graphs will be overlapped and may be thermally broadened in a finalized device.

Figure 8:
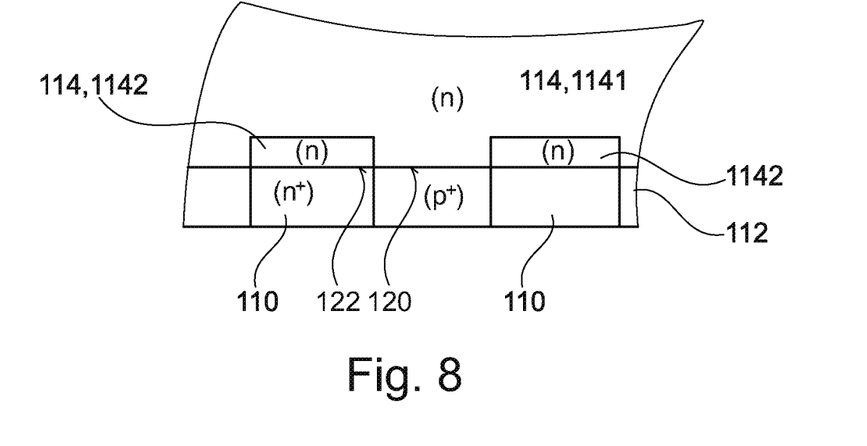
FIGS. 8 and 9 are schematic cross-sectional views for illustrating examples of field stop regions of a semiconductor device.

The schematic cross-sectional view of FIG. 8 is an example of a semiconductor device 100 that may be formed by a method, wherein the p$^+$-doped second region 112 if formed by an unmasked ion implantation process. The dopants of the n$^+$-doped first region 110 and the p-type dopants for partial compensation of the n-doping in the second sub-region 1142 are implanted through a same mask. In the illustrated example, a pn-junction 120 between the second region 112 and the field stop region 114 is located at a same vertical level as a separation plane 122 between the second sub-region 1142 of the field stop region 114 and the first region 110. In other examples, the plane 122 may be located closer to or farther from the second surface than the pn-junction 120.

Figure 9:
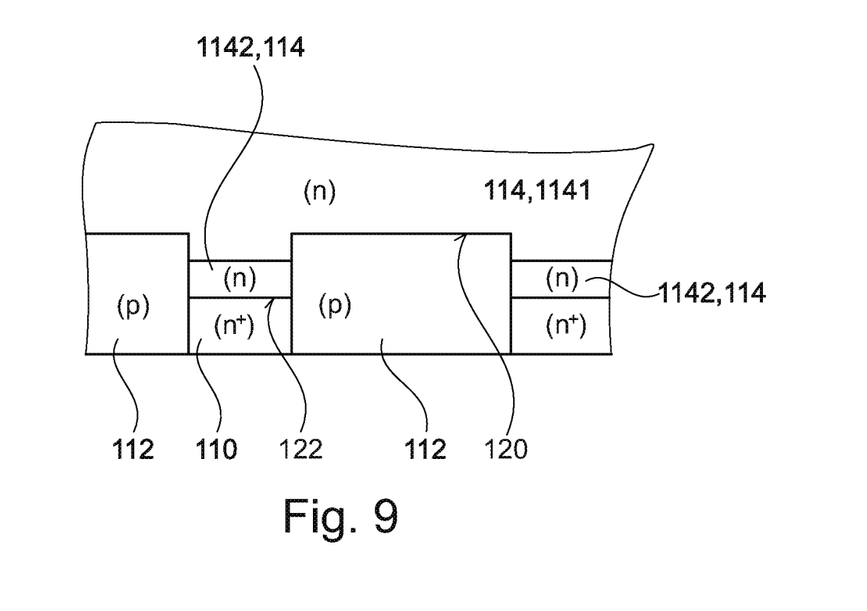

The schematic cross-sectional view of FIG. 9 is an example of a semiconductor device 100 that may be formed by a method, wherein p-type dopants for partial compensation of the n-doping in the second sub-region 1142 are formed by an unmasked ion implantation process, and wherein dopants for forming the first region 110 are implanted through a mask that differs from a mask used for implanting dopants of the second region 112.

FIGS. 10A to 10D are schematic cross-sectional views for illustrating examples of field stop regions of a semiconductor device comprising an embedded region.

Figure 10A:
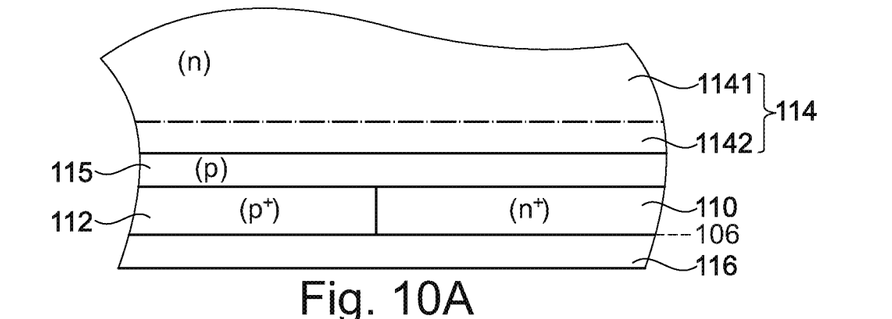
FIGS. 10A to 10D are schematic cross-sectional views for illustrating examples of a field stop region of a semiconductor device comprising an embedded region.

In the schematic cross-sectional view of FIG. 10A, the second sub-region 1142 of the n-doped field stop region 140 directly adjoins to the first region 110 and comprises a p-doped embedded region 115 of a second conductivity type integrated in the second sub-region 1142 of the field stop region 114. In the embedded region 115, p-type dopants outnumber n-type dopants. The embedded region 115 is electrically connected to the p$^+$-doped second region 112.

Figure 10B:
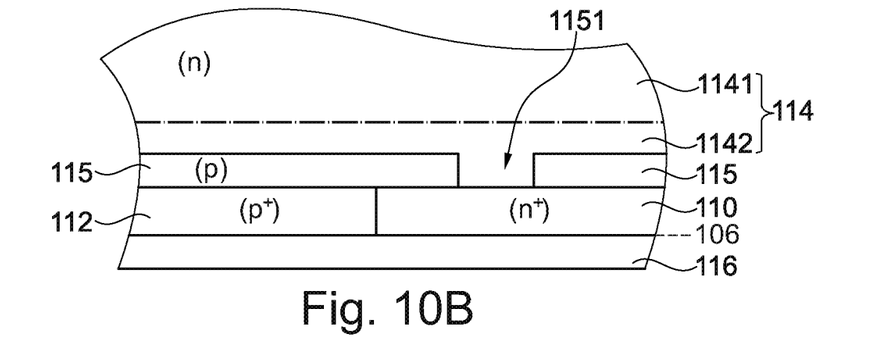

The example illustrated in FIG. 10B is similar to the example of FIG. 10A, but further includes an opening 1151 in the embedded region 150 over the n$^+$-doped first region 110. The field stop region 114 is electrically connected to the first electrode 116 via the opening 1151 in the embedded region 115.

Figure 10C:
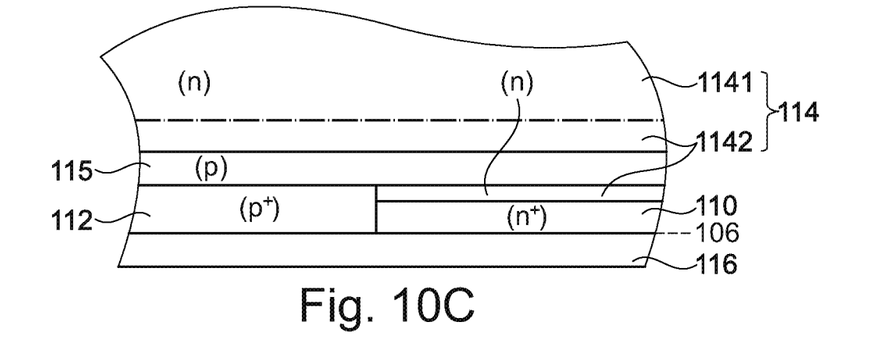
Figure 10D:
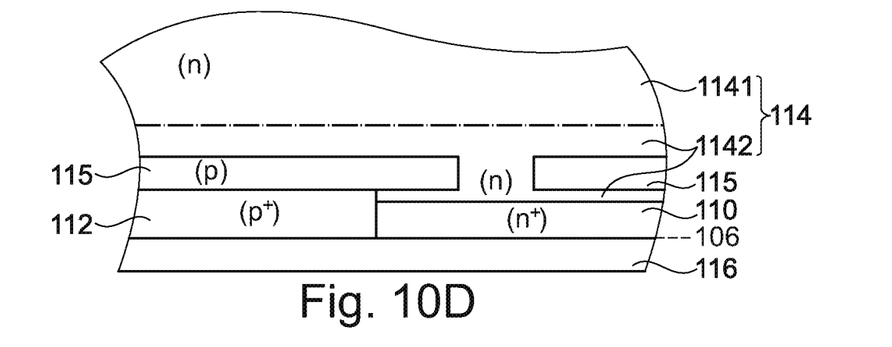

The examples illustrated in FIGS. 10C, 10D differ from the examples illustrated in FIGS. 10A, 10B, respectively, in that a part of the n-doped second sub-region 1142 is arranged between the embedded region 115 and the n$^+$-doped first region 110.

The examples illustrated in the figures may be combined and may further be combined with other designs not illustrated in the figures but disclosed as an example herein. By varying different designs of the p-dopants in the second region, e.g. dose, vertical extent, lateral extent, ratio of c2 to c3, softness of the diode may be improved, thereby enabling access for tuning a the semiconductor diode to the applications' need.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a drift region of a first conductivity type arranged between a first surface and a second surface of a semiconductor body;
   a first region of the first conductivity type at the second surface;
   a second region of a second conductivity type arranged adjacent to the first region at the second surface;
   a field stop region of the first conductivity type arranged between the drift region and the second surface;
   a first electrode on the second surface, wherein the first electrode is arranged directly adjacent to the first region in a first part of the second surface and to the second region in a second part of the second surface, wherein the field stop region includes a first sub-region and a second sub-region between the first sub-region and the second surface, wherein over a predominant portion of the first part of the second surface, the second sub-region directly adjoins to the first region and includes dopants of the second conductivity type that partially compensate dopants of the first conductivity type; and
   an embedded region of the second conductivity type integrated in the second sub-region of the field stop region, wherein the embedded region laterally overlaps both the first region and the second region.

2. The semiconductor device of claim 1, wherein the second sub-region of the field stop region directly adjoins to the first region over all of the first part of the second surface.

3. The semiconductor device of claim 1, wherein a lateral concentration profile of the dopants of the second conductivity type and/or a lateral concentration profile of the dopants of the first conductivity type is constant in the second sub-region of the field stop region over a predominant portion of the first part of the second surface.

4. The semiconductor device of claim 1, wherein the dopants of the second conductivity type partially compensate at least 10% of the dopants of the first conductivity type in at least a portion of the second sub-region of the field stop region.

5. The semiconductor device of claim 1, wherein a vertical concentration profile of the dopants of the second conductivity type extends from within the second sub-region of the field stop region to the second surface.

6. The semiconductor device of claim 5, wherein a vertical concentration profile of dopants of the second conductivity type along a predominant vertical extent of the second region corresponds to a vertical concentration profile of the dopants of the second conductivity type extending from the second sub-region of the field stop region, through the first region, and to the second surface.

7. The semiconductor device of claim 1, wherein a carrier mobility in the second sub-region of the field stop region is by more than 10% smaller than a carrier mobility in the first sub-region of the field stop region.

8. The semiconductor device of claim 1, wherein a concentration of the dopants of the second conductivity type in a portion of the second sub-region of the field stop region is larger than $1 \times 10^{15}$ cm$^{-3}$.

9. The semiconductor device of claim 1, wherein an effective concentration of dopants of the first conductivity type in the portion of the second sub-region of the field stop region ranges between $1 \times 10^{14}$ cm$^{-3}$ and $2 \times 10^{16}$ cm$^{-3}$.

10. The semiconductor device of claim 1, wherein a vertical position where the concentration profile of the dopants of the first conductivity type constituting the first region intersects a concentration profile of dopants of the first conductivity type constituting the field stop region defines the vertical extension of the first region to the second surface.

11. The semiconductor device of claim 10, wherein the dopants of the second conductivity type include boron, the dopants of the first conductivity type include phosphorus, and the field stop region includes hydrogen-related donors.

12. The semiconductor device of claim 11, wherein a pn junction between the second region and the field stop region is located closer to the second surface than a separation plane between the second sub-region of the field stop region and the first region.

13. The semiconductor device of claim 1, wherein a separation plane between the second sub-region of the field stop region and the first region is located closer to the second surface than a pn junction between the second region and the field stop region.

14. The semiconductor device of claim 1, wherein a concentration profile of the dopants of the second conductivity type in the second sub-region of the field stop region has a peak.

15. The semiconductor device of claim 1, wherein a concentration profile of the dopants of the second conductivity type in the second sub-region of the field stop region continuously decreases toward the first surface.

16. A semiconductor device, comprising:
a drift region of a first conductivity type arranged between a first surface and a second surface of a semiconductor body;
a first region of the first conductivity type at the second surface;
a second region of a second conductivity type arranged adjacent to the first region at the second surface;
a field stop region of the first conductivity type arranged between the drift region and the second surface; and
a first electrode on the second surface,
wherein the first electrode is arranged directly adjacent to the first region in a first part of the second surface and to the second region in a second part of the second surface,
wherein the field stop region includes a first sub-region and a second sub-region between the first sub-region and the second surface,
wherein over a predominant portion of the first part of the second surface, the second sub-region directly adjoins to the first region and comprises an embedded region of a second conductivity type integrated in the second sub-region of the field stop region,
wherein in the embedded region, dopants of the second conductivity type outnumber dopants of the first conductivity type,
wherein the embedded region is electrically connected to the second region,
wherein the embedded region laterally overlaps both the first region and the second region.

17. A method for manufacturing a semiconductor device, the method comprising:
providing a semiconductor body including a drift region of a first conductivity type arranged between a first surface and a second surface of the semiconductor body;
forming a first region of the first conductivity type at the second surface;
forming a second region of a second conductivity type arranged adjacent to the first region at the second surface;
forming a field stop region of the first conductivity type arranged between the drift region and the second surface; and
forming a first electrode on the second surface,
wherein the first electrode is arranged directly adjacent to the first region in a first part of the second surface and to the second region in a second part of the second surface,
wherein the field stop region includes a first sub-region and a second sub-region between the first sub-region and the second surface,
wherein over a predominant portion of the first part of the second surface, the second sub-region directly adjoins to the first region and includes dopants of the second conductivity type that partially compensate dopants of the first conductivity type,
wherein forming the field stop region comprises integrating an embedded region of the second conductivity type in the second sub-region of the field stop region, the embedded region laterally overlapping both the first region and the second region.

18. The method of claim 17, wherein forming the second region includes one unmasked ion implantation process and a second implantation process, and wherein dopants for forming the first region and the dopants of the second conductivity type are implanted through a same mask.

19. The method of claim 17, wherein the dopants of the second conductivity type are formed by an unmasked ion implantation process, and wherein dopants for forming the first region are implanted through a mask that differs from a mask used for implanting dopants of the second region.

* * * * *